(12) United States Patent
Boccard et al.

(10) Patent No.: US 11,905,220 B2
(45) Date of Patent: Feb. 20, 2024

(54) MANUFACTURE OF A CERAMIC COMPONENT

(71) Applicant: ROLEX SA, Geneva (CH)

(72) Inventors: Cyriaque Boccard, Douvaine (FR); Ollivier Pujol, Lausanne (CH)

(73) Assignee: ROLEX SA, Genèva (CH)

( * ) Notice: Subject to any disclaimer, the term of this patent is extended or adjusted under 35 U.S.C. 154(b) by 890 days.

(21) Appl. No.: 16/605,599

(22) PCT Filed: Apr. 16, 2018

(86) PCT No.: PCT/EP2018/059693
§ 371 (c)(1),
(2) Date: Oct. 16, 2019

(87) PCT Pub. No.: WO2018/192886
PCT Pub. Date: Oct. 25, 2018

(65) Prior Publication Data
US 2020/0123064 A1    Apr. 23, 2020

(30) Foreign Application Priority Data

Apr. 20, 2017   (EP) .................................. 17167229

(51) Int. Cl.
C23C 16/455   (2006.01)
C04B 35/628   (2006.01)
(Continued)

(52) U.S. Cl.
CPC ...... *C04B 35/62884* (2013.01); *A44C 27/001* (2013.01); *C04B 35/119* (2013.01); *C04B 35/44* (2013.01); *C04B 35/48* (2013.01); *C04B 35/62842* (2013.01); *C04B 35/62894* (2013.01); *C04B 35/638* (2013.01); *C04B 35/63416* (2013.01); *C04B 35/63488* (2013.01);
(Continued)

(58) Field of Classification Search
CPC ............................................. C23C 16/45525
See application file for complete search history.

(56) References Cited

U.S. PATENT DOCUMENTS 4,940,523 A   7/1990   Takeshima
5,928,977 A   7/1999   Magnin et al.
(Continued)

FOREIGN PATENT DOCUMENTS

CN   1193617 A   9/1998
CN   1972880 A   5/2007
(Continued)

OTHER PUBLICATIONS

Office Action dated Oct. 9, 2021, issued in counterpart CN application No. 201880026157.8, with English translation. (20 pages).
(Continued)

*Primary Examiner* — Joseph A Miller, Jr.
(74) *Attorney, Agent, or Firm* — WHDA, LLP

(57) ABSTRACT

The method for manufacturing a ceramic component, in particular component containing zirconia and/or alumina, for a timepiece or a jewelry piece, is characterised in that it includes a step (E3) of depositing at least one additional element or compound on a ceramic powder, optionally bound, by atomic layer deposition (ALD).

16 Claims, 2 Drawing Sheets

| Constituents | | 1-ALD | 2-ALD | 3-ALD |
|---|---|---|---|---|
| ZrO$_2$ stab. - TZ3Y (wt%) | | 99.685 | 99.62 | 98.75 |
| Al$_2$O$_3$ (wt%) | | 0.25 | 0.25 | 0.25 |
| Pt (wt%) | | 0.065 | 0.13 | 1.0 |
| CIEL*a*b* | L* | 50.2 | 47.7 | 46.1 |
| | a* | 0.7 | 0.7 | 0.4 |
| | b* | 0.7 | 0.5 | 0 |

(51) Int. Cl.
*A44C 27/00* (2006.01)
*C04B 35/48* (2006.01)
*C04B 35/634* (2006.01)
*C04B 35/638* (2006.01)
*C04B 35/64* (2006.01)
*C23C 14/22* (2006.01)
*C23C 16/44* (2006.01)
*C22C 29/12* (2006.01)
*C04B 35/44* (2006.01)
*C04B 35/119* (2006.01)

(52) U.S. Cl.
CPC .............. *C04B 35/64* (2013.01); *C22C 29/12* (2013.01); *C23C 14/223* (2013.01); *C23C 16/4417* (2013.01); *C23C 16/45525* (2013.01); *C04B 2235/3246* (2013.01); *C04B 2235/40* (2013.01); *C04B 2235/408* (2013.01); *C04B 2235/9661* (2013.01)

(56) References Cited

U.S. PATENT DOCUMENTS

| | | | |
|---|---|---|---|
| 6,613,383 B1 * | 9/2003 | George | C04B 41/009 |
| | | | 428/404 |
| 2002/0106461 A1 | 8/2002 | Talton | |
| 2003/0026989 A1 | 2/2003 | George et al. | |
| 2008/0160193 A1 * | 7/2008 | Mitchell | C23C 16/45525 |
| | | | 427/255.19 |
| 2010/0240519 A1 | 9/2010 | Nakasuga et al. | |
| 2013/0072373 A1 | 3/2013 | Pujol et al. | |
| 2015/0307406 A1 | 10/2015 | Pujol et al. | |
| 2019/0006697 A1 | 1/2019 | Danko et al. | |

FOREIGN PATENT DOCUMENTS

| | | | |
|---|---|---|---|
| CN | 102947245 A | 2/2013 | |
| CN | 106011791 A | 10/2016 | |
| EP | 0 345 795 A1 | 12/1989 | |
| EP | 2 746 242 A1 | 6/2014 | |
| EP | 2746243 A1 | 6/2014 | |
| GB | 2501763 A | 11/2013 | |
| JP | S62-59571 A | 3/1987 | |
| JP | 5-270820 A | 10/1993 | |
| JP | 2005-501176 A | 1/2005 | |
| WO | 2003/008186 A1 | 1/2003 | |
| WO | 2007/108416 A1 | 9/2007 | |
| WO | 2016/147208 A1 | 9/2016 | |

OTHER PUBLICATIONS

Office Action dated Oct. 8, 2021, issued in counterpart CN application No. 201880026191.5, with English translation. (18 pages).
Itoh et al., "Microstructure and properties of the sintered composite prepared by hot pressing of TiN-coated alumina powder", Journal of Materials Science, vol. 28, No. 24, 1993, pp. 6761-6766; cited in the International Search Report.
Ensinger et al., "Noble metal deposition on aluminum oxide powder surfaces by ion beam sputtering", Nuclear Instruments and Methods in Physics Research B, vol. 141, Nos. 1-4, 1998, pp. 693-698; cited in the International Search Report.
Brust et al., "CVE Coating of Oxide Particles for the Production of Novel Particle-Reinforced Iron-Based Metal Matrix Composites", Open Journal of Applied Sciences, vol. 6, No. 4, 2016, pp. 260-269; cited in the International Search Report.
McCormick et al., "Rotary reactor for atomic layer deposition on large quantities of nanoparticles", J. Vac. Science Technology: Part A, vol. 25, No. 1, pp. 67-74; cited in the International Search Report.
International Search Report and Written Opinion dated Jun. 19, 2018 issued in corresponding application No. PCT/EP2018/059693; w/ English partial translation and partial machine translation (25 pages).
Office Action dated Feb. 1, 2022, issued in counterpart JP Application No. 2019-556851, with English translation. (12 pages).
Office Action dated Jan. 11, 2022, issued in counterpart JP Application No. 2019-556880, with English translation. (12 pages).
Office Action dated Mar. 29, 2021, issued in counterpart EP Application No. 18 717 376.0. (6 pages).
Non-Final Office Action dated Mar. 2, 2023, issued in U.S. Appl. No. 16/605,598. (28 pages).

* cited by examiner

| Constituents | | 1-ALD | 2-ALD | 3-ALD |
|---|---|---|---|---|
| $ZrO_2$ stab. - TZ3Y (wt%) | | 99.685 | 99.62 | 98.75 |
| $Al_2O_3$ (wt%) | | 0.25 | 0.25 | 0.25 |
| Pt (wt%) | | 0.065 | 0.13 | 1.0 |
| CIEL*a*b* | L* | 50.2 | 47.7 | 46.1 |
| | a* | 0.7 | 0.7 | 0.4 |
| | b* | 0.7 | 0.5 | 0 |

MANUFACTURE OF A CERAMIC COMPONENT

INTRODUCTION

The present invention relates to a process for manufacturing a ceramic powder and a ceramic component. Such a ceramic powder and component find applications in watchmaking and jewellery. Particularly, such a component finds applications in a timepiece, in particular for decorative components such as a bezel, or functional components such as movement parts.

PRIOR ART

In the field of watchmaking, just as in jewellery, it is known to use ceramic components, in particular decorative components. However, one limiting factor in the use of these ceramic components stems from the fact that it is difficult, or even impossible, to obtain certain colours, in particular certain grey hues, and the difficulty in obtaining an even, predictable and reproducible colour. Furthermore, obtaining a particular hue requires the production of an entire batch of material from the initial components, and proves time-consuming and complex.

Another limiting factor also stems from the fact that it is difficult to test the effect of adding certain elements, which can be combined with the constituents of known ceramics, in particular to obtain certain particular mechanical characteristics of the ceramic component. Here, too, each test is complex and requires the production of an entire batch of material from the initial constituents.

The usual process for manufacturing a ceramic component comprises a first phase that consists in preparing the raw material, i.e. the ceramic powder, such as for example a ceramic powder based on zirconia and/or alumina. In this first phase, this raw material is generally prepared in the form of a ceramic powder to which it is possible to add, for example, other oxides in order to strengthen the ceramic component, or pigments in order to obtain a coloured material. The pigments are generally of the metal oxide type or the rare-earth oxide type, and are added to and mixed with the base ceramic powder via a liquid route, the pigments being thus introduced using a carrier liquid.

A second phase of the process for manufacturing a ceramic component consists in incorporating a binder into the ceramic powder obtained in the first phase. Such a binder generally consists of one or more organic compounds. The nature and proportion of the binder depend on the intended process in a third phase, and at the end of this phase reference is generally made to a ceramic powder with binder.

The third phase consists of a shaping of the ceramic component. To that end, a first approach comprises a step of pressing an agglomerate of particles with binder obtained at the end of the second phase: in such a process, the second phase prepares a ceramic powder with binder in the form of spray-dried pressing granules. A second approach consists of a shaping by injection moulding. In such a case, the preparation resulting from the second phase is a ceramic powder with binder referred to as "feedstock". A third approach consists of a shaping by casting in a mould, commonly referred to as slip casting. In such a case, the preparation resulting from the second phase is a ceramic powder with binder in suspension, referred to as slip or also "slurry". At the end of the third phase, the ceramic component has a shape which is close to its final shape and contains both the ceramic powder and the binder. Other shaping techniques such as gel casting, freeze casting or else coagulation casting techniques may be used.

A fourth phase allows the ceramic component to be finished. This fourth phase comprises a first step that consists in debinding the component, i.e. eliminating the binder, for example via a heat treatment or using a solvent. A second step allows the component to be compacted, eliminating the pores arising from the binder removal. This second step generally consists of a sintering heat treatment (firing at high temperature). The final colour of the ceramic component, and also its final mechanical properties, appear only at the end of this fourth phase and are derived from the reactions between the various constituents of the component and also from the atmosphere present in the furnace, which come into play during the heat treatment. These reactions are complex and sometimes unpredictable.

It is observed that the conventional process for manufacturing a ceramic component, recalled above, has several drawbacks. Particularly, the colour and the final properties obtained are dependent on numerous parameters such as the microstructure of the powder formed in the first phase, in particular the size of the grains of ceramic, the size of the pigments, their reactivity with the ceramic and the sintering environment, etc. The properties are further dependent on all of the other factors linked to the other manufacturing phases, such as the size and number of pores in the final component, the composition of the grain boundaries, the density, the percentage of the pigment(s) and their distribution within the matrix, their possible combination with one another or with the constituents of the ceramic raw material or the atmosphere during the sintering, the chemical purity of the initial compounds and the possible presence of intrinsic and extrinsic contaminants. This multiplicity of parameters to be taken into account makes it difficult to predict and reproduce a certain colour that it is desired to manufacture. This observation is even more true if the amount of colouring pigments is small: thus, to lessen this drawback, all the existing processes necessarily use a large amount of pigments. Furthermore, certain processes attempt to improve the result by adding steps based on complex chemistry, which naturally has the drawback of further complicating the manufacturing process.

What is more, the difficulty in managing the colours of a ceramic component leads, in practice, to the need for numerous tests, comprising the production of numerous complete samples, from the preparation of the ceramic powder up to the final shaping, while varying some of the abovementioned parameters for each sample in order to determine the optimal process. Furthermore, when it is desired to modify a colour, even slightly, it is necessary to restart the entire process, including, once again, preparing numerous samples. Thus, in practice, the search for a controlled colour of a ceramic component, which is often necessary for the use thereof as a decorative element, requires complex and laborious development steps.

Finally, in spite of the numerous tests, it is observed to date that it appears impossible to obtain ceramic components having certain colours, in particular certain grey colours such as those defined by the CIE L*a*b* colour coordinates (83; 0; 0.6) and CIE L*a*b* colour coordinates (47; 0.2; −0.2). Generally, a colour defined for example by a* and b* parameters close to 0 and an L* parameter of less than 96, in particular a strictly grey colour, is impossible to obtain.

Thus, the general objective of the present invention is to propose a solution for manufacturing ceramic component, in particular for a timepiece, which does not have the drawbacks of the prior art.

More precisely, a first object of the present invention is to propose a solution for manufacturing a ceramic powder and a ceramic component which makes it possible to obtain a ceramic having improved properties, in particular the colour of which is controlled and/or in particular which ceramic is endowed with novel or optimized properties for example from among mechanical, thermal, electrical and tribological properties.

A second object of the present invention is to propose a solution for the simplified manufacture of a coloured ceramic component.

A third object of the present invention is to propose a grey ceramic.

A fourth object of the present invention is to propose a simple method for modifying a ceramic powder that may already be coloured in order to modify the resulting colour of the finished ceramic component.

BRIEF DESCRIPTION OF THE INVENTION

For this purpose, the invention is based on a process for manufacturing a ceramic powder with or without binder or a ceramic component, in particular based on zirconia and/or alumina and/or strontium aluminate, in particular for a timepiece or a jewellery part, wherein it comprises a step of depositing at least one additional element or compound on a ceramic powder with or without binder by an atomic layer deposition (ALD), potentially followed by other atomic layer depositions (ALD) and/or by a chemical vapour deposition (CVD) and/or by a physical vapour deposition (PVD).

The invention is more specifically defined by the claims.

BRIEF DESCRIPTION OF THE FIGURES

These objects, features, and advantages of the present invention will be disclosed in detail in the following non-limiting description of a particular embodiment given with reference to the appended figures, in which.

Hereinafter, a ceramic component or powder will denote a component or powder obtained from a polycrystalline dense material mainly comprising at least one ceramic, in particular based on zirconia and/or alumina and/or strontium aluminate, for example a zirconia stabilized with yttrium oxide and/or cerium oxide and/or magnesium oxide and/or calcium oxide. A ceramic powder will denote a powder in the form of a finely divided solid, composed of fine particles of ceramic, in particular based on zirconia and/or alumina and/or strontium aluminate. In order to simplify the description, the same term of ceramic powder will be retained intentionally in a general manner for a powder mainly comprising fine particles of ceramic, but also other added elements such as for example one or more pigments, or oxides for strengthening the ceramic, such as yttrium oxide. Similarly, a ceramic component will denote a component for example obtained by sintering of such a ceramic powder. Thus, the ceramic powder or component comprises, in all cases, predominantly a component of ceramic type, i.e., at least 50% by weight of this component of ceramic type, or even at least 75%, or even at least 90%. For example, the ceramic powder or component comprises at least 50% by weight of zirconia.

In all cases, a ceramic powder contains no organic compound. The generic term "ceramic powder with binder" will denote a composite material consisting of a ceramic powder and a binder, generally consisting of one or more organic compounds, in variable proportions, and intended for the shaping of a part by pressing, by injection moulding, by casting or by other techniques.

A (pressing) granule will denote an agglomerate of ceramic powder with binder, intended to be shaped by a pressing process, for example cold or hot uniaxial pressing, or cold or hot isostatic pressing. A granule generally comprises between 1% and 4% inclusive by weight of organic compounds.

The term "injectable ceramic powder", also generally known as "feedstock", will denote a ceramic powder with binder intended to be shaped by a high- or low-pressure injection-moulding process. An injectable ceramic powder generally comprises between 12% and 25% inclusive by weight of organic compounds.

The term "slurry" will denote a ceramic with binder powder intended to be shaped by slip casting or gel casting. A slurry generally comprises between 1% and 25% inclusive by weight of organic compounds.

Figure 1:
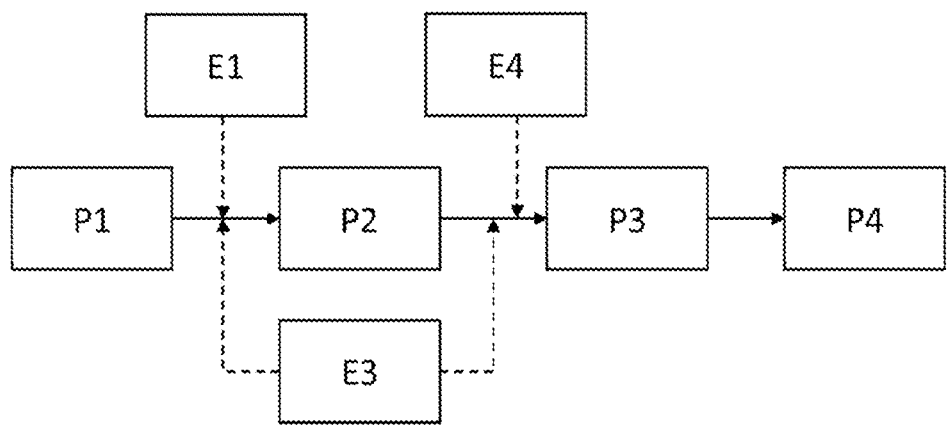
FIG. 1 schematically represents a flow chart of the steps of the process for manufacturing a coloured ceramic component for a timepiece, according to an embodiment of the present invention.

The process for manufacturing a ceramic component according to an embodiment of the invention comprises the phases and steps schematically represented by the flow chart of FIG. 1.

This manufacturing process therefore comprises the customary phases P1 to P4 of the process, namely the preparation of the ceramic powder (P1), the addition of a binder (P2), the shaping of the component (P3) and the debinding-sintering heat treatment (P4). The conventional parts of these phases will not be described in detail at this stage since they are known from the prior art. A person skilled in the art will therefore know how to implement them, including according to any existing variants or equivalences.

The embodiment of the invention differs from the conventional process in particular by the addition of a step E3 of depositing at least one additional element or compound, for example a colouring element, via a dry route, by an atomic layer deposition, known by the acronym ALD.

This deposition step E3 is implemented on a ceramic powder with or without binder, therefore after the first phase P1 or after the second phase P2 of the manufacturing process. It can therefore be implemented on a ceramic powder comprising ceramic particles only or on a ceramic powder comprising organic compounds, for example on a granule or on injection-moulding feedstock. It is implemented before the third phase P3 of the process. In order to simplify the description, the ceramic powder comprising one or more additional elements or compounds, obtained by implementation of the deposition step E3 of the invention, will continue to be referred to as ceramic powder with or without binder.

The additional element or compound may be very varied, particularly a metal, and/or an oxide, and/or a nitride and/or a carbide. A metal is understood to mean a pure metal or an alloy. Therefore, it may advantageously be a metal-based compound. For the sake of simplicity, the terms additional element or additional compound will be used in the remainder of the document without distinction, both for a single element and for a compound or an alloy.

Novelly, the invention also enables the use of metals which could not be used with the existing solutions, such as noble metals with a high melting point, above or equal to 1200° C., or even above or equal to 1500° C. Thus, the invention makes it possible to use, as additional element, platinum, and/or rhodium, and/or osmium, and/or palladium, and/or ruthenium, and/or iridium.

As a variant, other metals may be used, and the preceding list may be supplemented by gold, aluminum, silver, rhenium, titanium, tantalum or niobium. In addition, the transition metals characterized by an incomplete d shell, according to the list below, make it possible to obtain a particularly unprecedented and advantageous result owing to their addition according to the particular deposition step E3 of the invention: iron, chromium, vanadium, manganese, cobalt, nickel and copper. Similarly, the lanthanides (La, Ce, Pr, Nd, Pm, Sm, Eu, Gd, Tb, Dy, Ho, Er, Tm, Yb and Lu) make it possible to dope the ceramic powders with or without binder during step E3 and to obtain advantageous colours and/or properties. As mentioned above, the additional compound may therefore be an alloy comprising or consisting of one or more of the metals and lanthanides listed above.

Thus, an additional compound may be a metal compound or alloy, obtained by the direct deposition of the metal alloy on the ceramic powder with or without binder or by the combination of successive or simultaneous depositions of several of the elements of the metal alloy on the ceramic powder with or without binder.

Similarly, an additional compound may be an oxide, a carbide or a nitride of one or more metals, obtained by the direct deposition of the oxide, carbide or nitride on the ceramic powder with or without binder or by the reaction of a metallic deposition with a reactive atmosphere, in particular in the deposition chamber or after the deposition, for example during a step of sintering the ceramic compound.

Naturally, several different additional elements or compounds may be used and deposited on the same ceramic powder, simultaneously or successively, by one or more deposition steps E3 as described above. This increase in the additional compounds available naturally makes it possible to increase the possible colours for a ceramic, and also the other possible properties, in particular mechanical or tribological properties.

It should be noted that those skilled in the art are accustomed to adding colour pigments to a ceramic by a liquid route. They are not accustomed to doing so by a dry route, or to carrying out a deposition directly onto a ceramic powder with or without binder. During such a dry deposition under vacuum, the following parameters should be considered:

the homogeneity of the deposition on the powders,
  the homogeneity of shape and size of the grains of the powder,
  the temperatures of the process,
  the risk of degassing,
  the electrostatic nature of the (insulating) moving divided solids,
  the finish and nature of the materials of the equipment; it is in particular necessary to correctly select the pairing between the nature of the deposition and the nature of the binders of the granules in order to prevent the powder sticking to the equipment.

It is observed that the process of the invention makes it possible to achieve very satisfactory results, with respect to the novel or improved properties of the ceramic components, even with very small amounts of additional compound added to the ceramic. Thus, the colour of a ceramic component is not only improved compared to the existing solutions in that it is homogeneous and/or can permit new hues, but moreover this improved result is obtained by adding an additional colouring element or compound in a very small amount, in particular in an amount much lower than the amount of colouring pigments used with the conventional methods.

For example, the ALD deposition process is used to obtain contents by weight of additional element(s) or compound(s) of less than or equal to 3%, but also in particular less than or equal to 2%, or even less than or equal to 1%, or even less than or equal to 0.05%, or even less than or equal to 0.01%. It should be noted that all the contents by weight are measured on the finished ceramic component (after carrying out the fourth phase of the manufacturing process), or on the debound ceramic powder, i.e., not considering the weight of the binder. Advantageously, these contents are greater than or equal to 1 ppm. Advantageously, these contents are between 1 ppm and 0.01% inclusive, or even between 1 ppm and 0.05% inclusive, or even between 1 ppm and 3% inclusive. The invention therefore has the advantage of obtaining very advantageous results with a small amount of additional compound material, or even a very small amount of material, without having to prepare an entire batch each time, and additionally making it possible to iteratively modify a basic batch.

Moreover, it is important to emphasize that the process of the invention makes it possible to obtain a homogeneous distribution or good dispersion of an additional compound, and thus ultimately to obtain a ceramic component of homogeneous property (for example colour). If the deposition of an additional element is carried out on a ceramic powder, therefore before carrying out the second phase of the process, the ceramic powder thus enriched undergoes a succession of dispersion/wet grinding steps during the second phase P2, in order to bind it with an organic compound, before spray drying it in order to make therefrom, for example, granules at the end of the second phase P2 of the process. This second phase P2 thus makes it possible to homogeneously distribute the additional compound. As a variant, if the additional compound is deposited after the second phase P2 of the process, therefore for example directly on granules, the additional compound is distributed over the surface of the granules owing to the deposition process used, and is thus distributed homogeneously over the ceramic powder with binder. The additional compound will be distributed homogeneously in the finished sintered ceramic component.

The conformity of the ALD deposition makes it possible to distribute the coating over the powder, and in the case of a metal coating, the powder becomes less electrostatic. It agglomerates less.

In the two preceding cases, the analysis of the body obtained at the end of the fourth phase (P4) shows that the homogeneous distribution of the additional compound is retained in the finished ceramic component. If the deposition has been carried out on the ceramic powder, a final distribution of the particles of additional compound in the ceramic microstructure appears which is random and microscopically homogeneous. In the case of depositions onto the injection-moulding feedstock, the homogenization of the distribution of the particles of the additional compound in the material takes place in particular during the step of plasticizing of the molten mixture by the injection-moulding screw. Thus, in all cases, the ceramic component comprises an additional element distributed homogeneously in its volume, which allows it to have the property provided by this additional element distributed homogeneously in the ceramic component.

Finally, the deposition step E3 of the embodiment of the invention provides the following main advantages:

it makes it possible to obtain an addition of an additional element or compound that is perfectly controlled in terms of composition and amount and is in a very small amount, and therefore makes it possible to implement micro-metering of the additional compound or element;

it makes it possible to ultimately obtain a homogeneous distribution of the additional compound in the ceramic component;

it makes it possible to add a multitude of additional compounds, increasing the number of possible additional compounds in comparison to the existing solutions, increasing the possibilities for providing a ceramic component with certain properties;

it enables a reliable, repeatable and clean deposition of an additional compound.

The invention is illustrated below by examples which make it possible to manufacture a grey ceramic component, having hues that are impossible to produce with conventional techniques. All the results obtained, in particular in terms of colour, are summarized in the table from FIG. 4.

The first example is based on the use of a ceramic powder without binder, composed of 3 mol % yttria-stabilized zirconia (TZ3YS). 10 g of this powder are placed in the vibrating bowl of an ALD chamber, which is evacuated, in order to start the deposition of platinum via the ALD process. 50 deposition cycles are carried out.

Figure 2:
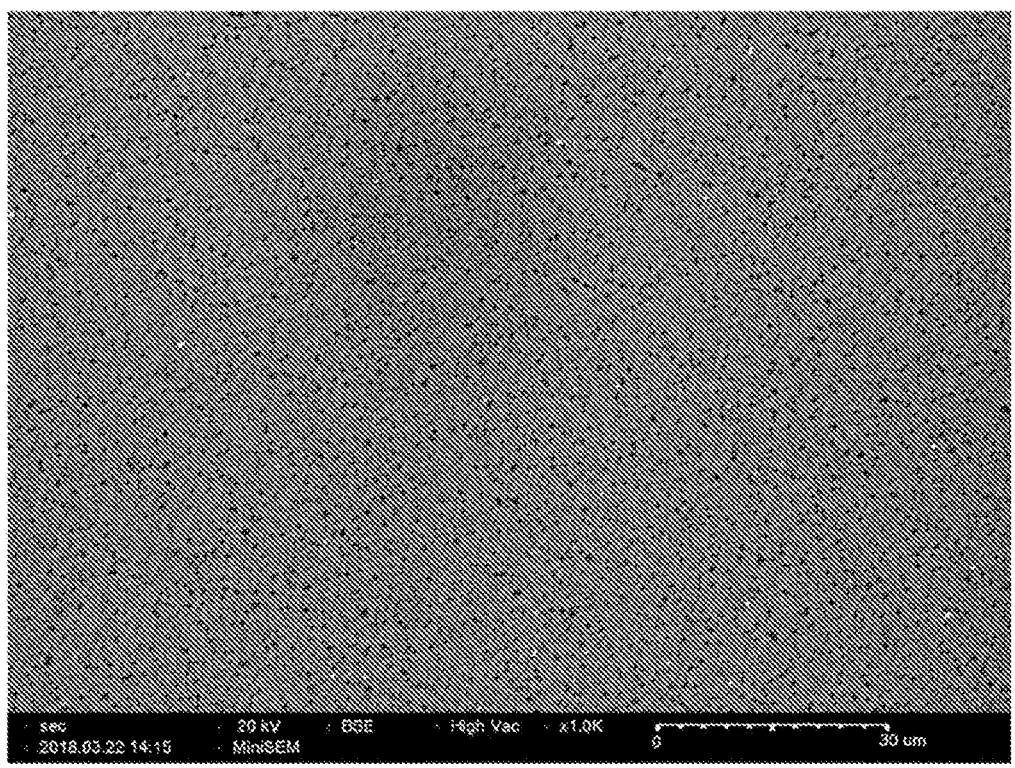
FIG. 2 represents the microstructure of a ceramic component obtained according to a first example according to an embodiment of the invention.

The ceramic powder thus coated then undergoes an attrition (mixing, wet grinding) and binding treatment. In this treatment, 0.6 g of PVA, 0.9 g of PEG 20000 and 116 ml of deionized water are added to 50.4 g of said platinum-covered ceramic powder. The suspension thus obtained is placed in the zirconia bowl of an attritor with 1 kg of zirconia beads to be attrited/ground for 2 hours at 400 rpm. The suspension is then recovered in order to be dried and granulated by spray drying using a "spray dryer". The granules thus obtained are then pressed in a cylindrical mould on a uniaxial press. The resulting pellet is debound in air at 600° C. for 18 hours. Finally it is sintered in air at 1450° C. with a hold of 2 hours. After sintering, the faces of the ceramic pellet are ground and then polished. The ceramic component obtained is grey in colour. FIG. 2 is an image, obtained by scanning electron microscopy (SEM), of the sintered ceramic pellet, which shows the distribution of the platinum particles (light dots). This figure makes it possible to demonstrate the homogeneous distribution of the platinum particles. Specifically, on the scale of the component, the distribution of these particles is considered to be homogeneous. The resulting colour appears homogeneous to the naked eye.

Figures 3, 4:
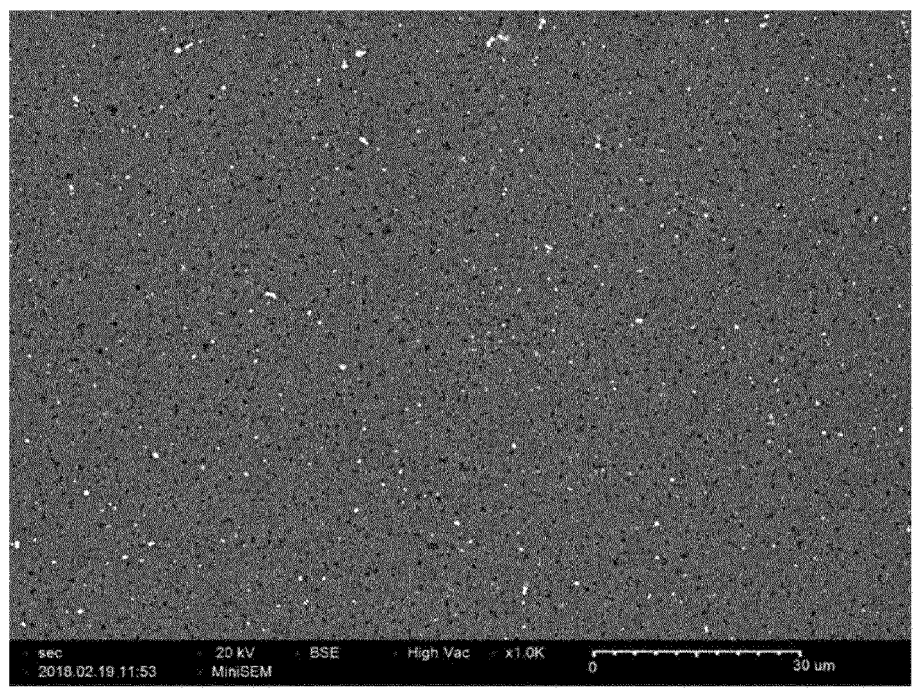
FIG. 3 represents the microstructure of a ceramic component obtained according to a second example according to an embodiment of the invention.
FIG. 4 consists of a table of results of ceramic components obtained according to the two preceding exemplary implementations of an embodiment of the invention.

The colour and the composition are given in the table from FIG. 4 under the reference 1 ALD 50.

The second example is based on the use of a ceramic powder without binder, composed of 3 mol % yttria-stabilized zirconia (TZ3YS). 10 g of this powder are placed in the vibrating bowl of an ALD chamber, which is evacuated, in order to start the deposition of platinum via the ALD process. 200 deposition cycles are carried out. The ceramic powder thus coated then undergoes an attrition (mixing, wet grinding) and binding treatment. In this treatment, 0.6 g of PVA, 0.9 g of PEG 20000 and 120 ml of deionized water are added to 50.4 g of said platinum-covered ceramic powder. The suspension thus obtained is placed in the zirconia bowl of an attritor with 1 kg of zirconia beads to be attrited/ground for 2 hours at 400 rpm.

The suspension is then recovered in order to be dried and granulated by spray drying using a "spray dryer". The granules thus obtained are then pressed in a cylindrical mould on a uniaxial press. The resulting pellet is debound in air at 600° C. for 18 hours. Finally, it is sintered in air at 1450° C. with a hold of 2 hours. After sintering, the faces of the ceramic pellet are ground and then polished. The ceramic component obtained is grey in colour. FIG. 3 is an image, obtained by scanning electron microscopy (SEM), of the sintered ceramic pellet, which shows the distribution of the platinum particles (light dots). This figure makes it possible to demonstrate the homogeneous distribution of the platinum particles. Specifically, on the scale of the component, the distribution of these particles is considered to be homogeneous. The resulting colour appears homogeneous to the naked eye. The colour and the composition are given in the table from FIG. 4 under the reference 2 ALD 200.

The table from FIG. 4 represents the results of the preceding examples. It is interesting to note that these examples make it possible to obtain a grey ceramic. Thus, generally, one embodiment of the invention advantageously makes it possible to manufacture a grey ceramic, characterized by the two parameters a* and b* between −1 and 1 inclusive.

As a variant, one embodiment of the invention may make it possible to manufacture a grey ceramic component, characterized by the two parameters a* and b* between −3 and 3 inclusive, or even between −2 and 2 inclusive, or even between −0.5 and 0.5 inclusive.

It should be noted that the attrition after the addition of the platinum makes it possible to better distribute the platinum in the material and does not significantly modify the colour of the ceramic obtained in these examples. A very slight increase in the density of the samples, linked to the attrition, is also observed. However, this attrition remains optional.

Naturally, the invention is not limited to the manufacture of a ceramic component containing platinum as additional compound. It is possible to obtain a grey colour with an additional compound other than platinum, for example with rhodium, palladium or any other grey noble metal that does not react with the other components of the ceramic or the sintering atmosphere. Furthermore, the invention is not limited to the manufacture of a ceramic component of a particular colour. Indeed it is possible to obtain numerous colours by varying the additional compound. It is observed that the addition of iron Fe gives a very slightly yellow ceramic. The addition of chromium Cr to a pure stabilized zirconia also gives a yellow ceramic with a slight red tendency. Chromium deposited on a zirconia to which 2 wt % alumina has been added gives a lighter, but redder material. The addition of vanadium V makes the ceramic yellow and the addition of aluminium Al has virtually no effect on the base colour.

Optionally, the manufacturing process may comprise a prior step E1 of adding another compound to the ceramic powder without binder, for example the addition of colouring pigments or any other compound according to the conventional approach recalled above or according to other techniques known to those skilled in the art, for example by salt precipitation. Indeed, the invention remains compatible with all other existing processes, and can be complementary thereto, for example for the enrichment thereof. This step E1 may be carried out at any suitable moment in the manufacturing process. It can be carried out before or after step E3.

According to another variant and optionally, the manufacturing process may comprise a subsequent step E4 of adding another additional element or compound to the ceramic powder with binder, after the deposition step E3 described previously. In this case the deposition step E3 by the ALD process may make it possible to render the surface of a ceramic powder conductive, for example by adding a metallic additional compound. This offers the advantage of limiting the risks of agglomeration of the ceramic powder, in particular within a PVD chamber for carrying out a physical vapour deposition, known by the acronym PVD, since the particles of this ceramic powder with binder have an electrostatic nature which tends to bring them together and to naturally form agglomerates, which is disadvantageous for the subsequent coating thereof with an additional compound. It should be noted that this first conductive additional compound does not need to cover the entire surface of the powder grains in order to be effective. It should be noted that this other additional compound deposited by any technique, PVD, CVD or ALD, may be identical to the one which has been deposited by the ALD deposition. As a variant, the two additional compounds deposited are different, in order to combine the properties thereof.

As is mentioned above, the prior art solution for colouring a ceramic component is complex and is not always satisfactory. Moreover, when it is desired to modify, even slightly, a hue of a ceramic component previously coloured using pigments according to the prior art, it appears very difficult to do so with the conventional technique, in particular because the pigments have a tendency to react with one another during the sintering. Thus, according to the prior art, it is long and laborious to modify the intensity (lightness) and/or the hue of the colour of a coloured ceramic: indeed, each attempt requires the creation of a new batch of ceramic powder having a new chemical composition, then the manufacture of an injection-moulding feedstock, up to the creation of the finished (sintered and polished) ceramic components.

With the process of the invention, it becomes much easier to carry out such a modification of colour or intensity. More generally, it becomes easy to carry out any other modification of a property of the ceramic component.

Thus, one embodiment of the invention is based on a process for manufacturing a ceramic powder or a ceramic component, in particular based on zirconia and/or alumina and/or strontium aluminate, which comprises the following steps:
  providing a ceramic powder with binder, obtained according to the process described previously, containing colouring pigments or more generally at least one added or additional compound that would make it possible to obtain a ceramic component of a first colour or more generally endowed with a first property, by manufacturing a ceramic component from this ceramic powder with binder;
  depositing E3-E4 at least one, colouring or other, additional element or compound on said ceramic powder with binder by a physical vapour deposition PVD and/or by a chemical vapour deposition CVD and/or by an atomic layer deposition ALD;
  completing the manufacture of the ceramic component from the ceramic powder with binder including the deposited additional compound in order to obtain a ceramic component, the colour of which is a second colour, different from the first colour, or more generally that is endowed with a second property, different from the first property.

By means of such a process, a first property obtained from a ceramic powder with binder can easily be modified to a powder with binder having a second property by adding an additional compound according to an embodiment of the invention. As this embodiment of the invention uses a step E3 that is easy to implement, to control and to reproduce, it becomes easy to carry out multiple tests to obtain, by trial and error, the desired final property for the ceramic component, without this requiring laborious intervention at the ceramic powder preparation stage.

Thus, the process for manufacturing a ceramic component may repeat steps of depositing at least one additional compound on said ceramic powder with binder, modifying the content of said additional compound, or even the additional compound itself, and of completing the manufacture of the ceramic component, until it has come sufficiently close to the desired result.

In practice, it is therefore possible to implement a step of selecting a ceramic powder with binder containing colouring pigments that make it possible to obtain a first colour close to a desired second colour, then to modify the colour by adding an additional colouring compound, until it has come sufficiently close to the desired colour. The same approach can be implemented for modifying any property other than colour, as mentioned previously.

Advantageously, the at least one additional compound is chosen such that it does not react with the added compounds already present in the ceramic powder with binder, for example colouring pigments.

The pigments present in the ceramic powder with binder may comprise one or more elements from among a metal oxide, and/or a rare-earth oxide, and/or a cobalt aluminate, and/or phosphorescent pigments.

More generally, the embodiment of the invention is simply compatible with all other techniques of adding at least one compound to a ceramic powder with or without binder. Thus, the invention may be combined with any other technique, in particular with a conventional approach, to obtain any type of ceramic having novel properties.

Furthermore, the colour of a ceramic component is particular important for a timepiece or jewellery part, because it makes it possible to obtain desired esthetics. Thus, the invention is particularly advantageous for manufacturing a horological or jewellery component. This horological component may in particular be a watch bezel, a dial, an index, a winding crown, a push button or any other horological casing element or element of a horological movement. The invention also relates to a timepiece, notably a watch, comprising such a horological component.

Naturally, the invention is not limited to a particular colour, nor to a given property of a ceramic component. Indeed, the concept of the invention is to multiply and simplify the possible enrichment of a ceramic component, and the invention ultimately enables the manufacture of a multitude of novel ceramic components.

In particular, a ceramic component obtained by an embodiment of the invention comprises at least one particular property obtained by a very small amount of an additional compound distributed in the ceramic component. This very small amount is less than or equal to 5% by weight, or less than or equal to 3% by weight, or less than or equal to 1% by weight, or less than or equal to 0.05% by weight, or less than or equal to 0.01% by weight, relative to the total weight of the completed ceramic compound. Furthermore, this amount will advantageously be greater than or equal to 1 ppm, or greater than or equal to 10 ppm excluding the organic compound(s).

Furthermore, the invention also relates to a device for manufacturing a ceramic component wherein it uses the ceramic component manufacturing process. To this end, the manufacturing device comprises a chamber for carrying out an atomic layer deposition (ALD) and optionally physical vapour deposition (PVD) or chemical vapour deposition (CVD).

The invention claimed is:

1. A process for manufacturing a ceramic component, wherein the process comprises:
    manufacturing a ceramic powder with or without binder comprising at least one additional element or compound by depositing the at least one additional element or compound on a base ceramic powder by an atomic layer deposition (ALD), and
    after performing the depositing of the at least one additional element or compound,
    performing a provisional shaping of the ceramic powder with binder comprising the at least one additional element or compound, then
    debinding the provisionally shaped ceramic component including eliminating organic compound(s) followed by sintering the ceramic component.

2. The process for manufacturing a ceramic component as claimed in claim 1, wherein the depositing comprises adding the at least one additional element or compound in a total amount in the ceramic powder, excluding possible organic compound(s), of less than or equal to 3% by weight.

3. The process for manufacturing a ceramic component as claimed in claim 1, wherein the depositing comprises adding the at least one additional compound or element in a total amount of greater than or equal to 1 ppm, excluding organic compound(s).

4. The process for manufacturing a ceramic component as claimed in claim 1, wherein the at least one additional element or compound is selected from the group consisting of metals, metal alloys, oxides, nitrides, and carbides.

5. The process for manufacturing a ceramic component as claimed in claim 4, wherein the additional element or compound is or comprises at least one metal selected from at least one of the following four lists:
    a noble metal with a high melting point, selected from the group consisting of platinum, rhodium, osmium, palladium, ruthenium, and iridium;
    a metal selected from the group consisting of gold, aluminum, silver, rhenium, titanium, tantalum and niobium;
    a transition metal selected from the group consisting of aluminum, iron, chromium, vanadium, manganese, cobalt, nickel and copper;
    a lanthanide selected from the group consisting of lanthanum, cerium, praseodymium, neodymium, promethium, samarium, europium, gadolinium, terbium, dysprosium, holmium, erbium, thulium, ytterbium and lutetium.

6. The process for manufacturing a ceramic component as claimed in claim 1, wherein the at least one additional element or compound is a metal alloy, obtained by direct deposition of the metal alloy on the base ceramic powder with or without binder or by a combination of successive or simultaneous depositions of several elements of the metal alloy or compound on the base ceramic powder with or without binder.

7. The process for manufacturing a ceramic component as claimed in claim 1, wherein the at least one additional element or compound is an oxide, a carbide or a nitride of one or more metals, obtained by direct deposition of the oxide, carbide or nitride on the base ceramic powder with or without binder or by reaction of a metallic deposition with a reactive atmosphere.

8. The process for manufacturing a ceramic component as claimed in claim 1, wherein the depositing comprises simultaneous or successive deposition of several different additional elements or compounds.

9. The process for manufacturing a ceramic component as claimed in claim 1, wherein the depositing comprises adding the at least one additional element or compound to the base ceramic powder with binder, comprising an organic compound in an amount of between 1% and 4% inclusive by weight or between 12% and 25% inclusive by weight, or comprising no organic compound.

10. The process for manufacturing a ceramic component as claimed in claim 1, wherein the process comprises:
    firstly, preparing a base ceramic powder, then—performing the depositing of the at least one additional element or compound on the base ceramic powder by an atomic layer deposition (ALD), then
    secondly, incorporating a binder comprising an organic material into the base ceramic powder comprising the at least one additional element or compound; then,
    optionally, performing another depositing of a second at least one other additional element or compound, identical to or different from the at least one additional element or compound, on the base ceramic powder by at least one selected from the group consisting of a physical vapor deposition (PVD), a chemical vapor deposition (CVD) and an atomic layer deposition (ALD);
    or wherein the process comprises:
    firstly, preparing a base ceramic powder, then
    secondly, incorporating a binder comprising an organic material into the base ceramic powder in order to form the base ceramic powder with binder; then
    performing the depositing of the at least one additional element or compound on the base ceramic powder with binder by an atomic layer deposition (ALD); then
    optionally, performing another depositing comprising depositing a second at least one other additional element or compound, identical to or different from the at least one additional element or compound, on the base ceramic powder by at least one selected from the group consisting of a physical vapor deposition (PVD), a chemical vapor deposition (CVD) and an atomic layer deposition (ALD).

11. The process for manufacturing a ceramic component as claimed in claim 1, wherein the process comprises adding coloring pigments or phosphorescent pigments to the ceramic powder with or without binder, before or after depositing the at least one additional element or compound.

12. The process for manufacturing a ceramic component as claimed in claim 1, wherein the process comprises:
    providing the base ceramic powder with binder containing at least one added compound whose presence makes it possible to obtain a ceramic component of a first color from the ceramic powder with binder;

performing the depositing of the at least one additional element or compound on the base ceramic powder with binder;

completing manufacture of the ceramic component from the ceramic powder with binder including the at least one deposited additional element or compound so as to obtain a ceramic component, wherein the ceramic component is of a second color, different from the first color.

13. The process for manufacturing a ceramic component as claimed in claim 12, wherein the process comprises repeating the depositing of the at least one additional element or compound on the base ceramic powder with binder, wherein the several depositions of the at least one additional compound differ by varying the amount and/or the nature of the at least one additional element or compound, until the second color of the ceramic component has come sufficiently close to a desired color after completion of the manufacture of the ceramic component.

14. The process for manufacturing a ceramic component as claimed in claim 12, wherein the process comprises selecting the ceramic powder with binder containing at least one compound that makes it possible to obtain a value for a property that approaches a desired value of the property, wherein the property is selected from the group consisting of a mechanical property, thermal property, tribological property, color property and combinations thereof.

15. The process for manufacturing a ceramic component as claimed in claim 1, wherein the process comprises:

providing the base ceramic powder with binder containing at least one added compound whose presence makes it possible to obtain a ceramic component of a first color from the ceramic powder with binder;

performing the depositing of the at least one additional element or compound on the base ceramic powder with binder;

completing manufacture of the ceramic component from the ceramic powder with binder including the at least one deposited additional element or compound so as to obtain a ceramic component, wherein the ceramic component is selected from the group consisting of a watch bezel, a dial, an index, a winding crown, a push button, an horological casing element and an element of a horological movement.

16. The process for manufacturing a ceramic component as claimed in claim 1, wherein the ceramic powder is based on at least one selected from the group consisting of zirconia, alumina and strontium aluminate.

\* \* \* \* \*